(12) United States Patent
Kang et al.

(10) Patent No.: US 9,129,922 B2
(45) Date of Patent: Sep. 8, 2015

(54) ORGANIC LIGHT-EMITTING DISPLAY DEVICE AND METHOD OF MANUFACTURING THE SAME

(75) Inventors: Tae-Min Kang, Yongin (KR); Jin-Woo Park, Yongin (KR); Noh-Min Kwak, Yongin (KR); Seung-Mook Lee, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 74 days.

(21) Appl. No.: 13/430,272

(22) Filed: Mar. 26, 2012

(65) Prior Publication Data

US 2013/0001631 A1  Jan. 3, 2013

(30) Foreign Application Priority Data

Jun. 28, 2011 (KR) .................. 10-2011-0063030

(51) Int. Cl.
| | |
|---|---|
| H01L 27/14 | (2006.01) |
| H01L 29/04 | (2006.01) |
| H01L 29/15 | (2006.01) |
| H01L 27/32 | (2006.01) |
| H01L 51/00 | (2006.01) |
| H01L 51/56 | (2006.01) |

(52) U.S. Cl.
CPC ........ *H01L 27/3246* (2013.01); *H01L 51/0013* (2013.01); *H01L 51/56* (2013.01)

(58) Field of Classification Search
CPC ............ H01L 27/3244; H01L 27/3246; H01L 27/3248; H01L 27/3258; H01L 2227/323; H01L 2251/5315; H01L 51/5253; H01L 27/12; H01L 51/5088; H01L 51/5092; H01L 51/5206; H01L 51/5237; H01L 2251/558; H01L 27/3209; H01L 27/3262; H01L 27/3281; H01L 33/42; H01L 51/5048

USPC ........ 257/40, 66, 72, 79–103, 223, 227, 291, 257/292, 439, 443, 655, E27.1, E27.125, 257/E27.112, E29.117, E29.145, E29.147, 257/E29.151, E29.182, E29.202, 257/E29.273–E29.299, E29.314, E29.32, 257/E23.016, E51.018, E21.211; 438/29, 438/149, 486, 34, 46; 313/504, 506, 500, 313/507, 509, 498, 508, 512

See application file for complete search history.

(56) References Cited

U.S. PATENT DOCUMENTS

| 2004/0135501 | A1* | 7/2004 | Nishikawa ................... 313/506 |
| 2006/0097623 | A1* | 5/2006 | Abe et al. .................... 313/498 |
| 2007/0052353 | A1 | 3/2007 | Yang et al. | |

(Continued)

FOREIGN PATENT DOCUMENTS

| JP | 2002-280187 | 9/2002 |
| KR | 10-2007-0029019 | 3/2007 |
| KR | 100833773 B1 | 5/2008 |

*Primary Examiner* — Colleen A Matthews
*Assistant Examiner* — Junaiden Mirsalahuddin
(74) *Attorney, Agent, or Firm* — Christie, Parker & Hale, LLP

(57) ABSTRACT

An organic light-emitting display device and a method of manufacturing the same. The organic light-emitting display device has a structure including an organic layer between a pixel electrode and an opposite electrode, the organic layer including a emissive layer and an insulating layer defining a light emission area. Accordingly, the insulating layer included in the organic layer functions as a pixel-defining layer, and thus, "edge open", which is generated when forming an emissive layer on a thick pixel-defining layer according to the comparable art, may be reduced or prevented.

4 Claims, 13 Drawing Sheets

(56) References Cited

U.S. PATENT DOCUMENTS

| | | | |
|---|---|---|---|
| 2007/0231503 A1* | 10/2007 | Hwang et al. | 428/1.1 |
| 2008/0054795 A1* | 3/2008 | Ohmi et al. | 313/504 |
| 2010/0200846 A1* | 8/2010 | Kwack et al. | 257/40 |
| 2011/0108848 A1* | 5/2011 | Lee et al. | 257/72 |

\* cited by examiner

ORGANIC LIGHT-EMITTING DISPLAY DEVICE AND METHOD OF MANUFACTURING THE SAME

CROSS-REFERENCE TO RELATED PATENT APPLICATION

This application claims priority to and the benefit of Korean Patent Application No. 10-2011-0063030, filed on Jun. 28, 2011, in the Korean Intellectual Property Office, the disclosure of which is incorporated herein in its entirety by reference.

BACKGROUND

1. Field of the Invention

The following description relates to organic light-emitting display devices and methods of manufacturing the same, and more particularly, to organic light-emitting display devices, in which a structure of an organic layer is improved, and methods of manufacturing the same.

2. Description of Related Art

In general, an organic light-emitting display device comprises an organic layer interposed between a pixel electrode and an opposite electrode as a component of a display unit. The organic layer comprises an emissive layer from which light is emitted. Recently, a laser induced thermal imaging (LITI) method, which is a dry process through which minute patterns may be formed, is frequently used to form the organic layer.

In the LITI method, a donor film on which an organic layer is deposited is placed on a pixel electrode such that the organic layer on the donor film is transferred to a pixel location by heat and laser is irradiated on the pixel electrode.

However, when the LITI is performed, "edge open", a phenomenon in which a gap is formed at an end portion of the organic layer due to a pixel-defining layer surrounding the pixel electrode, is frequently caused. In other words, generally, a pixel-defining layer that regulates a pixel area is formed to surround a boundary of the pixel electrode, and then the organic layer is formed on the pixel-defining layer to adhere to the pixel electrode by using the LITI method, and a step portion formed due to a thickness of the pixel-defining layer creates one or more gaps at an edge portion of the organic layer that contacts the pixel electrode. In this case, luminance of the display device becomes non-uniform, which in turn may cause product defects. Thus, a solution to solve this problem is needed.

SUMMARY

One or more aspects of embodiments of the present invention are directed toward organic light-emitting display devices in which a structure of an organic layer is improved to improve adhesive properties between the organic layer and a pixel electrode, and methods of manufacturing the same.

According to an embodiment of the present invention, there is provided an organic light-emitting display device comprising a pixel electrode, an opposite electrode facing the pixel electrode, and an organic layer interposed between the pixel electrode and the opposite electrode, wherein the organic layer comprises an emissive layer from which light is emitted and an insulating layer that defines a light emission area of the emissive layer.

The insulating layer may define the light emission area in units of pixels.

The organic light-emitting display device may further comprise: a hole injection/transport layer that is disposed between the emissive layer of the organic layer and the pixel electrode, and supplies holes to the emissive layer; and an electron injection/transport layer that is disposed between the emissive layer and the opposite electrode, and supplies electrons to the emissive layer.

The insulating layer may be disposed either between the hole injection/transport layer and the emissive layer, between the emissive layer and the electron injection/transport layer, or between the electron injection/transport layer and the opposite electrode.

The insulating layer may have a thickness of about 500 Å to about 2000 Å.

According to another embodiment of the present invention, there is provided a method of manufacturing an organic light-emitting display device, the method comprising: preparing a substrate on which a pixel electrode is formed; preparing a donor film on which an emissive layer and an insulating layer that is patterned to define a light emission area of the emissive layer are formed; adhering the donor film to the substrate to transfer the emissive layer and the insulating layer to be stacked on the pixel electrode of the substrate; and forming an opposite electrode on the emissive layer and the insulating layer.

The method may further comprise: forming a hole injection/transport layer between the pixel electrode and the emissive layer to supply holes to the emissive layer; and forming an electron injection/transport layer between the emissive layer and the opposite electrode to supply electrons to the emissive layer.

The insulating layer may be disposed either between the hole injection/transport layer and the emissive layer, between the emissive layer and the electron injection/transport layer, or between the electron injection/transport layer and the opposite electrode.

Transferring of the emissive layer and the insulating layer may be performed using a laser induced thermal imaging (LITI) method.

The insulating layer may have a thickness of about 500 Å to about 2000 Å.

According to another embodiment of the present invention, there is provided a method of manufacturing an organic light-emitting display device, the method comprising: preparing a substrate on which a pixel electrode is formed; preparing a first donor film on which an emissive layer is formed and a second donor film on which an insulating layer that defines a light emission area of the emissive layer is formed; sequentially adhering the first and second donor film on the substrate to transfer the emissive layer and the insulating layer to be stacked on the pixel electrode of the substrate; and forming an opposite electrode on the emissive layer and the insulating layer.

The method may further comprise: forming a hole injection/transport layer between the pixel electrode and the emissive layer to supply holes to the emissive layer; and forming an electron injection/transport layer between the emissive layer and the opposite electrode to supply electrons to the emissive layer.

The method may further comprise disposing the insulating layer either between the hole injection/transport layer and the emissive layer, between the emissive layer and the electron injection/transport layer, or between the electron injection/transport layer and the opposite electrode.

Transferring of the emissive layer and the insulating layer may be performed using a laser induced thermal imaging (LITI) method.

The insulating layer may have a thickness of about 500 Å to about 2000 Å.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION

The present invention will now be described more fully with reference to the accompanying drawings, in which exemplary embodiments of the invention are shown.

First, a structure of an organic light-emitting display device according to an embodiment of the present invention will be described with reference to FIG. 1.

Figure 1:
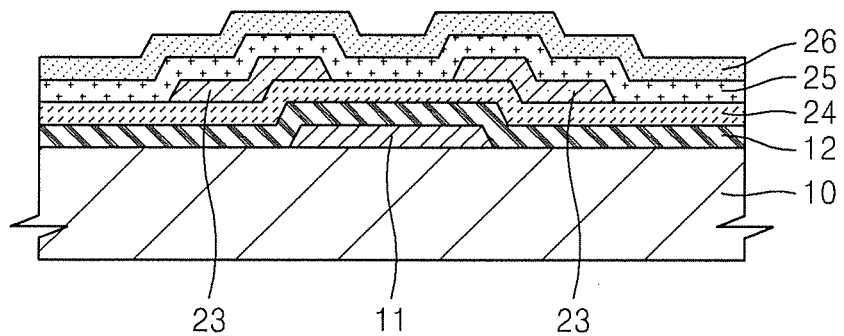
FIG. 1 is a cross-sectional view illustrating a structure of an organic light-emitting display device according to an embodiment of the present invention.

Referring to FIG. 1, the organic light-emitting display device includes a substrate 10, and a pixel electrode 11, an organic layer, and an opposite electrode 26 that are sequentially stacked on the substrate 10.

The organic layer includes an emissive layer 24, and a hole injection/transport layer 12 and an electron injection/transport layer 25 that supply holes and electrons to the emissive layer 24, respectively. Also, an insulating layer 23, which defines a light emission area of the emissive layer 24, is formed between the emissive layer 24 and the electron injection/transport layer 25. Precisely, the insulating layer 23 inside the organic layer functions as a comparable pixel-defining layer. In other words and according to the comparable art, a light emission area is defined by forming a pixel-defining layer surrounding a boundary of the pixel electrode 11 and then an organic layer is formed on the light emission area, while according to the current embodiment of the present invention, a pixel-defining layer is not additionally formed and instead the insulating layer 23 is formed inside the organic layer to function as a pixel-defining layer. In other words, the insulating layer 23 formed inside the organic layer covers edges of the emissive layer 24 to define a light emission area visually, and at the same time, the insulating layer 23 blocks the flow of holes or electrons that are supplied to the emissive layer 24 so that light is emitted only within a defined area. Accordingly, a light emission area may be defined in units of pixels without forming a thick pixel-defining layer, and thus preventing or protecting from problems such as edge open.

The insulating layer 23, functioning as a pixel-defining layer as described above, may be interposed at various suitable locations inside the organic layer. In other words, while the insulating layer 23 is formed between the emissive layer 24 and the electron injection/transport layer 25 in the current embodiment, the insulating layer 23 may also be formed between the emissive layer 24 and the hole injection/transport layer 12 as in an embodiment illustrated in FIG. 2. Alternatively, the insulating layer 23 may be formed between the electron injection/transport layer 25 and the opposite electrode 26 as in an embodiment illustrated in FIG. 3. In other words, by forming the insulating layer 23 in any suitable location inside the organic layer, a light emission area may be defined in units of pixels without forming an additional pixel-defining layer.

A thickness of the insulating layer 23 may be in a range from about 500 Å to about 2000 Å. In one embodiment, the insulating layer 23 having a thickness greater than 2000 Å is too thick, and another edge open is caused in adjacent layers. In another embodiment, if the thickness of the insulating layer 23 is less than about 500 Å, the insulating layer 23 can not properly function as an insulating layer.

The insulating layer 23 may be formed using insulating low molecules, oligomers, or polymers, which may be formed using a deposition method and/or a solution coating method. Also, polymer materials that may be formed into layers using a spin coating method or a printing process, such as poly (methyl methacrylate) (PMMA), polystyrene (PS), phenolic polymers, acrylic polymers, p-xylylene polymers, vinyl alcoholic polymers, parylenes, and a compound comprising at least one of these materials, may be used to form the insulating layer 23.

Hereinafter, a method of manufacturing the organic light-emitting display devices illustrated in FIGS. 1 through 3 will be described.

FIGS. 4A through 4E are cross-sectional views illustrating a method of manufacturing the organic light-emitting display device of FIG. 1, according to an embodiment of the present invention.

FIGS. 5A through 5F are cross-sectional views illustrating a method of manufacturing the organic light-emitting display device of FIG. 1, according to another embodiment of the present invention.

First, the organic light-emitting display device may be manufactured using the operations illustrated in FIGS. 4A through 4E or the operations illustrated in FIGS. 5A through 5F. The two sets of operations are performed using a laser induced thermal imaging (LITI) method: in the operations illustrated in FIGS. 4A through 4E, a donor film for the LITI method is used once; and in the operations illustrated in FIGS. 5A through 5F, a donor film for the LITI method is used twice.

First, the operations illustrated in FIGS. 4A through 4E will be described.

Figure 4A:
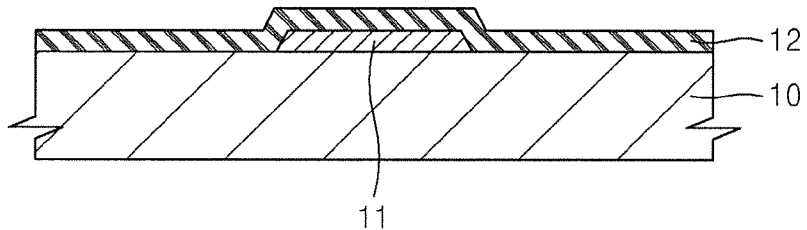
FIGS. 4A through 4E are cross-sectional views illustrating a method of manufacturing the organic light-emitting display device of FIG. 1, according to an embodiment of the present invention.

Initially, as illustrated in FIG. 4A, a pixel electrode 11 is disposed on a substrate 10, and a hole injection/transport layer 12 is formed on the pixel electrode 11. While not shown in detail in FIG. 4A, a thin-film transistor (not shown) is formed on the substrate 10 to be electrically connected to the pixel electrode 11.

Figure 4B:
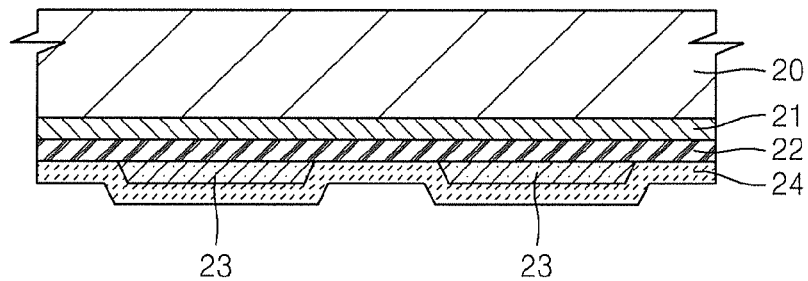

When the substrate 10 on which the pixel electrode 11 and the hole injection/transport layer 12 are formed is prepared, then as illustrated in FIG. 4B, a donor film 20 is provided. Basically, a light-to-heat conversion (LTHC) layer 21 and a protection layer 22 are formed on the donor film 20, and an insulating layer 23 and an emissive layer 24, which are thin layers to be transferred to the substrate 10, are formed on the LTHC layer 21 and the protection layer 22. Here, the insulating layer 23 is patterned in advance to define the light emission area of the emissive layer 24. In other words, the insulating layer 23 is uniformly formed on the protection layer 22 and then patterned into a form to define the light emission area of the emissive layer 24, and then the emissive layer 24 is formed on the insulating layer 23.

Figure 4C:
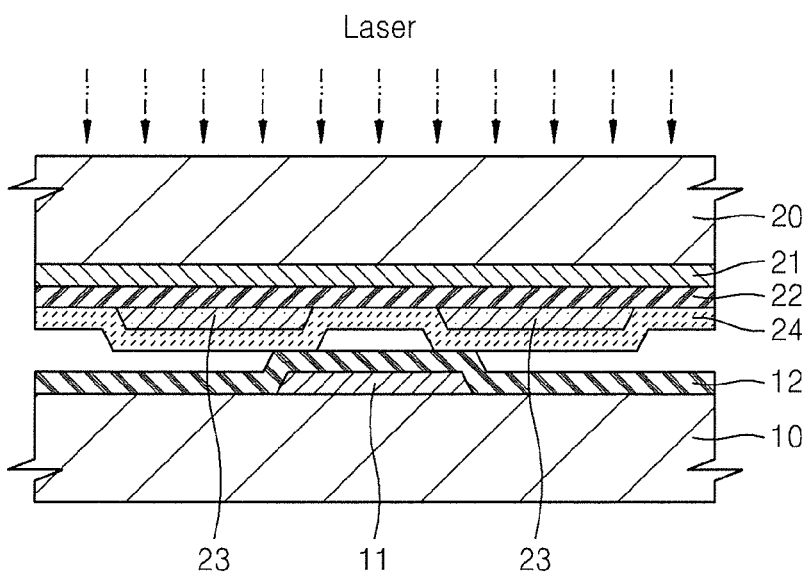

Then, the donor film 20 and the substrate 10 provided in the above-described manner are adhered to each other as illustrated in FIG. 4C, and then laser is completely irradiated onto the donor film 20 so that the emissive layer 24 and the insulating layer 23 are transferred to the substrate 10.

Figure 4D:
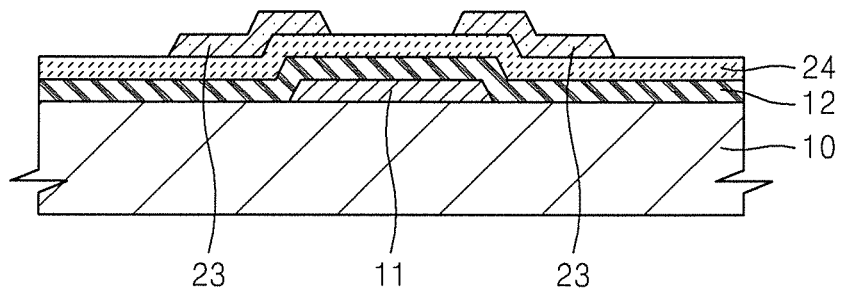

Then, as illustrated in FIG. 4D, the pixel electrode 11, the hole injection/transport layer 12, the emissive layer 24, and the insulating layer 23 are sequentially stacked on the substrate 10.

Figure 4E:
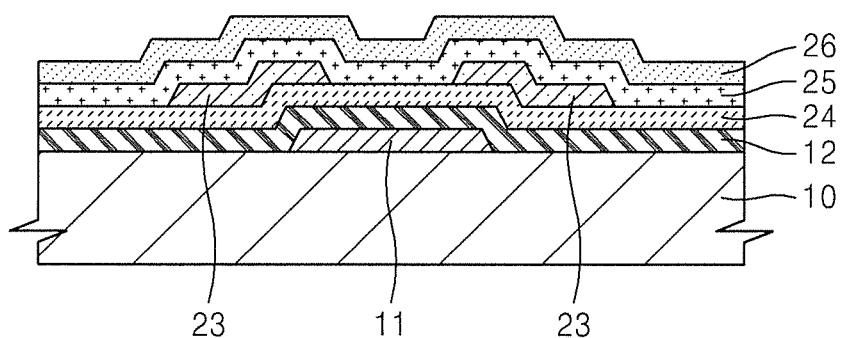

Then, as illustrated in FIG. 4E, an electron injection/transport layer 25 and an opposite electrode 26 are sequentially formed on the resultant structure, thereby completing the manufacture of the organic light-emitting display device of FIG. 1. Accordingly, without forming a pixel-defining layer, an organic layer, including the insulating layer 23 that functions the same as a pixel-defining layer, may be manufactured simply by using an LITI method using the donor film 20.

Hereinafter, a method of manufacturing the organic light-emitting display device of FIG. 1 using the operations illustrated in FIGS. 5A through 5F will be described.

Figure 5A:
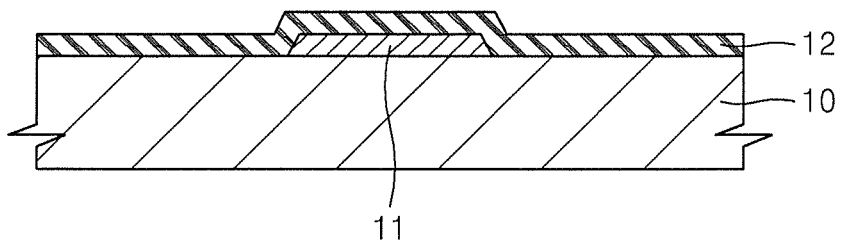
FIGS. 5A through 5F are cross-sectional views illustrating a method of manufacturing the organic light-emitting display device of FIG. 1, according to another embodiment of the present invention.

First, referring to FIG. 5A, a pixel electrode 11 is formed on a substrate 10 on which a thin-film transistor (not shown) is formed, and a hole injection/transport layer 12 is formed on the substrate 10 to cover the pixel electrode 11.

Figure 5B:
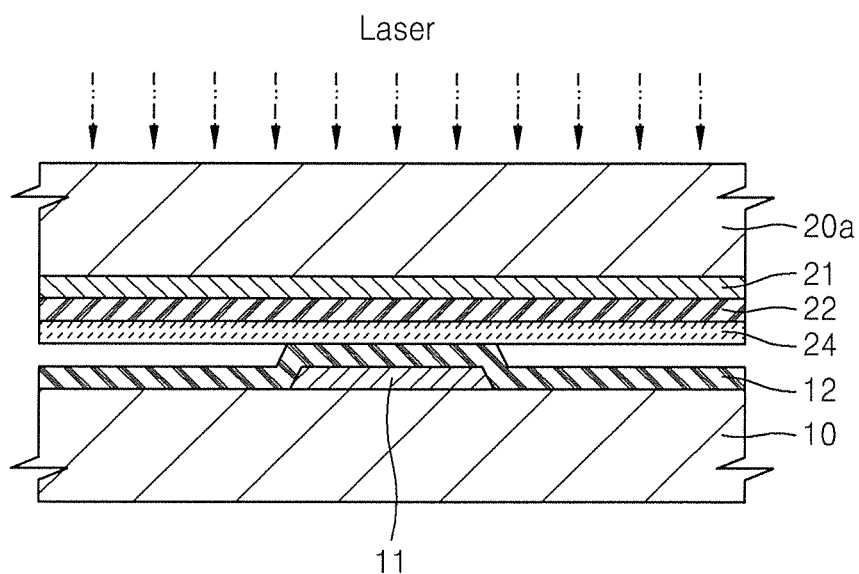
Figure 5C:
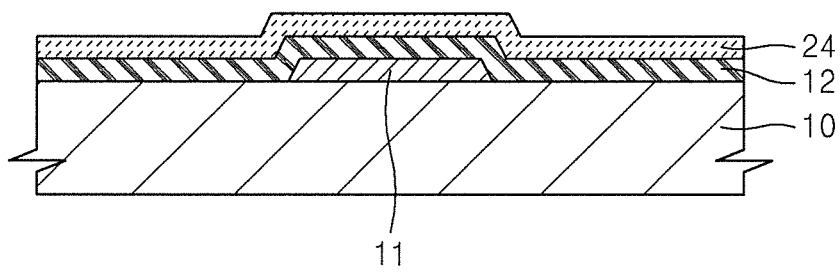

Then, a first donor film 20a, as illustrated in FIG. 5B, is adhered to the substrate 10, on which the pixel electrode 11 and the hole injection/transport layer 12 are provided, to perform an LITI method. An LTHC layer 21 and a protection layer 22 (used for an LITI method) and an emissive layer 24 (which is to be transferred to the substrate 10) are formed on the first donor film 20a. Accordingly, by performing an LITI operation of the first donor film 20a, a stacked structure in which the pixel electrode 11, the hole injection/transport layer 12, and the emissive layer 24 are stacked on the substrate 10 is formed as illustrated in FIG. 5C.

Figure 5D:
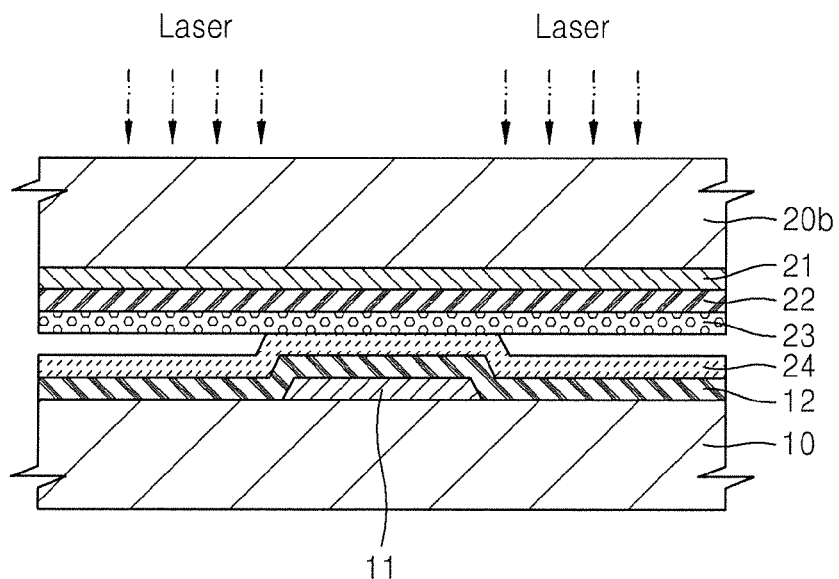
Figure 5E:
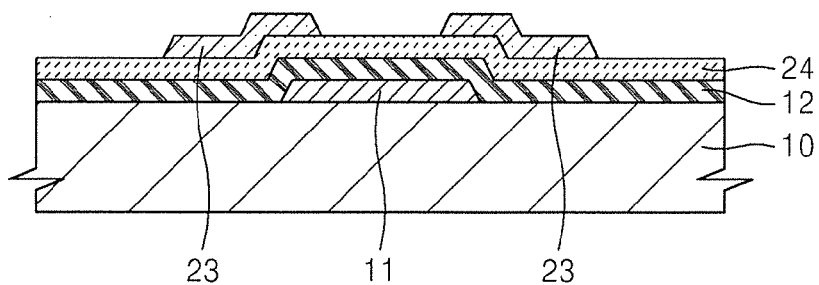

Then, a second donor film 20b as illustrated in FIG. 5D is formed to perform an LITI operation. An LTHC layer 21 and a protection layer 22 are also formed on the second donor film 20b and then an insulating layer 23 which is to be transferred to the substrate 10 is formed on the protection layer 22. Accordingly, by performing an LITI operation on the second donor film 20b, a stacked structure in which the pixel electrode 11, the hole injection/transport layer 12, the emissive layer 24, and the insulating layer 23 are stacked on the substrate 10 is formed as illustrated in FIG. 5E. At this time, a laser is not irradiated completely on the second donor film 20b, but only partially so that the insulating layer 23 is transferred only in a form that defines a light emission area. In other words, since the insulating layer 23 is not patterned on the second donor film 20b in advance, laser irradiating is partially performed so that only a desired form is transferred.

Figure 5F:
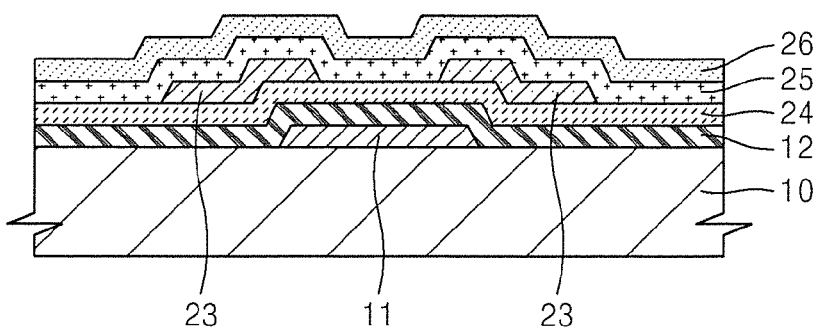

Then, as illustrated in FIG. 5F, an electron injection/transport layer 25 and an opposite electrode 26 are sequentially formed on the resultant structure, thereby completing the manufacture of the organic light-emitting display device of FIG. 1. Accordingly, without forming a pixel-defining layer, an organic layer, including the insulating layer 23 that functions the same as a pixel-defining layer, may be manufactured simply by using an LITI method using the first and second donor films 20a and 20b.

Figure 2:
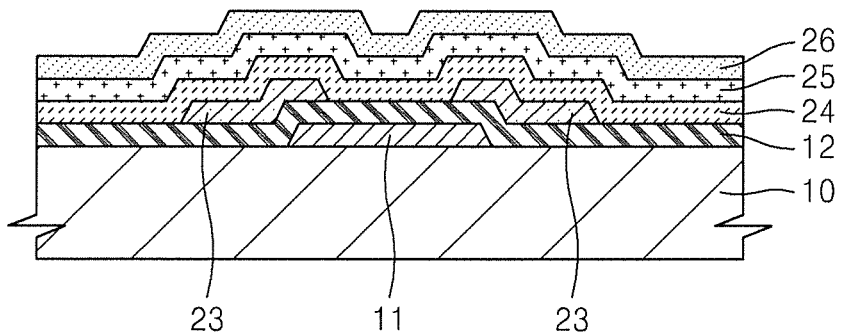
FIG. 2 is a cross-sectional view illustrating a structure of an organic light-emitting display device according to another embodiment of the present invention.

The organic light-emitting display device of FIG. 2 may be manufactured according to the operations illustrated in FIGS. 6A through 6E or the operations illustrated in FIGS. 7A through 7F.

FIGS. 6A through 6E are cross-sectional views illustrating a method of manufacturing the organic light-emitting display device of FIG. 2, according to an embodiment of the present invention.

FIGS. 7A through 7F are cross-sectional views illustrating a method of manufacturing the organic light-emitting display device of FIG. 2, according to another embodiment of the present invention.

First, the operations illustrated in FIGS. 6A through 6E will be described.

Figure 6A:
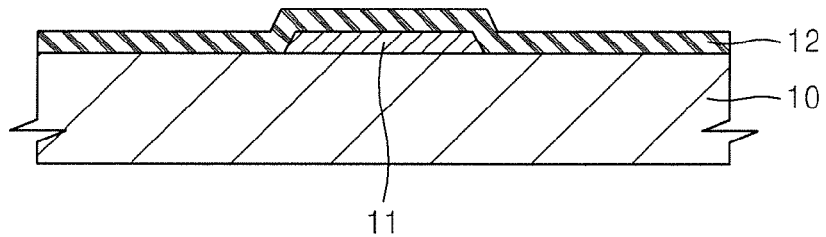
FIGS. 6A through 6E are cross-sectional views illustrating a method of manufacturing the organic light-emitting display device of FIG. 2, according to an embodiment of the present invention.

First, as also illustrated in FIG. 6A, a pixel electrode 11 is disposed on a substrate 10, on which a thin-film transistor (not shown) is formed, and a hole injection/transport layer 12 is formed on the pixel electrode 11, as shown in FIG. 6A.

Figure 6B:
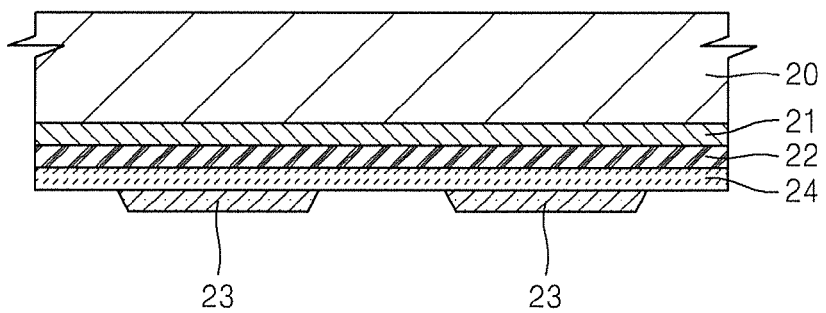

When the substrate 10 on which the pixel electrode 11 and the hole injection/transport layer 12 are formed is prepared, then as illustrated in FIG. 6B, a donor film 20 is provided. Basically, an LTHC layer 21 and a protection layer 22 for thermal transfer are formed on the donor film 20, and an insulating layer 23 and an emissive layer 24, which are to be transferred to the substrate 10, are formed on the LTHC layer 21 and the protection layer 22. Here, the insulating layer 23 is patterned in advance to define a light emission area of the emissive layer 24. In other words, the insulating layer 23 is uniformly formed on the emissive layer 24 and then patterned into a form to define the light emission area of the emissive layer 24.

Figure 6C:
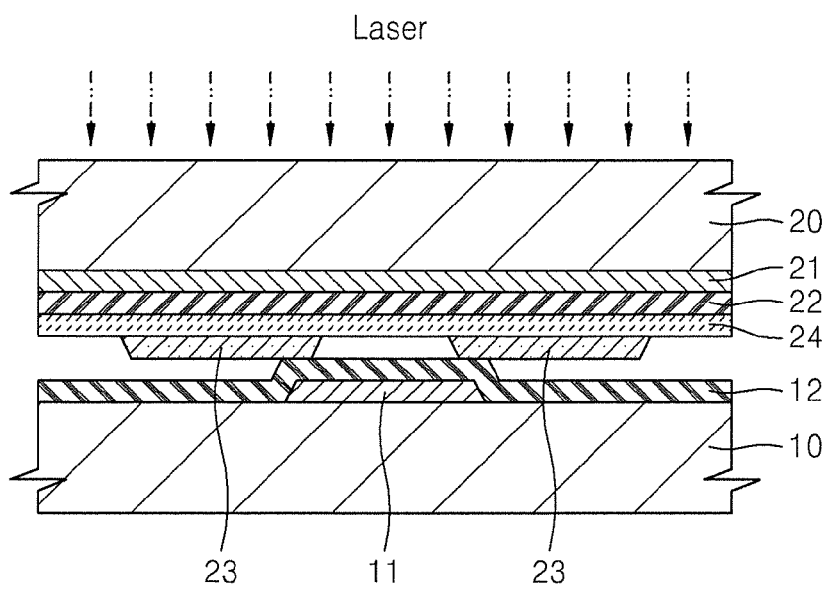

Then, the donor film 20 and the substrate 10 provided in the above-described manner are adhered to each other as illustrated in FIG. 6C, and then laser is completely irradiated to the donor film 20 so that the insulating layer 23 and the emissive layer 24 are transferred to the substrate 10.

Figure 6D:
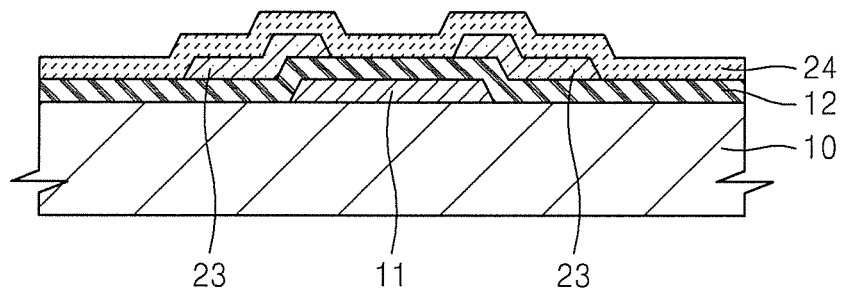

As a result, as illustrated in FIG. 6D, the pixel electrode 11, the hole injection/transport layer 12, the insulating layer 23, and the emissive layer 24 are sequentially stacked on the substrate 10.

Figure 6E:
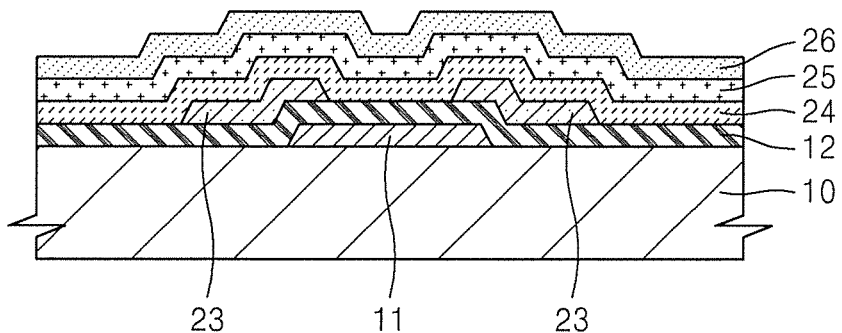

Then, as illustrated in FIG. 6E, an electron injection/transport layer 25 and an opposite electrode 26 are sequentially formed on the resultant structure, thereby completing the manufacture of the organic light-emitting display device of FIG. 2. Accordingly, without forming a pixel-defining layer, an organic layer, including the insulating layer 23 that functions the same as a pixel-defining layer, may be manufactured simply by using an LITI method using the donor film 20.

Hereinafter, a method of manufacturing the organic light-emitting display device of FIG. 2 using the operations illustrated in FIGS. 7A through 7F will be described.

Figure 7A:
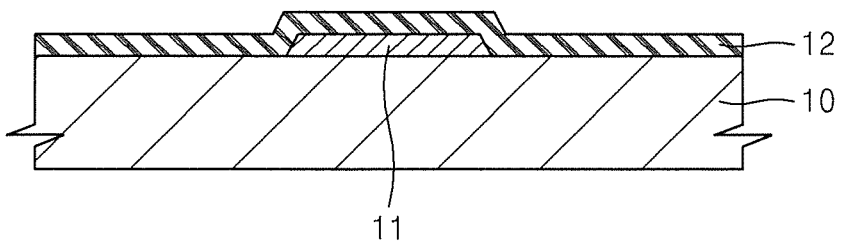
FIGS. 7A through 7F are cross-sectional views illustrating a method of manufacturing the organic light-emitting display device of FIG. 2, according to another embodiment of the present invention.

First, referring to FIG. 7A, a pixel electrode 11 is formed on a substrate 10 on which a thin-film transistor (not shown) is formed, and a hole injection/transport layer 12 is formed on the substrate 10 to cover the pixel electrode 11.

Figure 7B:
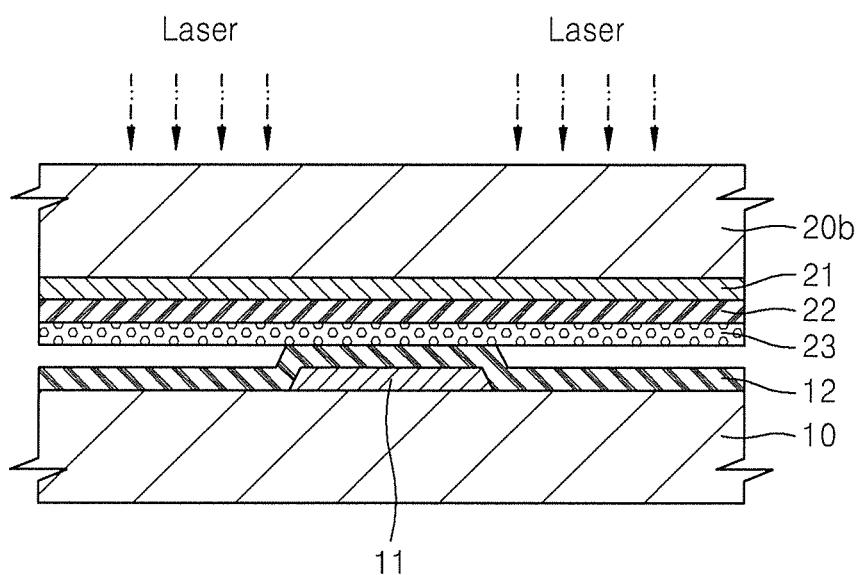
Figure 7C:
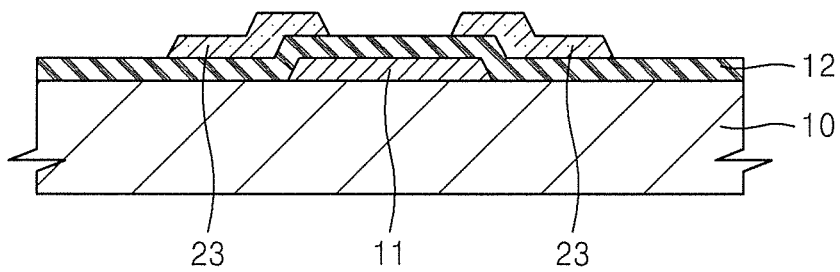

Then, a first donor film 20b as illustrated in FIG. 7B is adhered to the substrate 10, on which the pixel electrode 11 and the hole injection/transport layer 12 are provided, to perform an LITI method. An LTHC layer 21, a protection layer 22 for LITI, and an insulating layer 23, which is a thin film to be transferred to the substrate 10, are formed on the second donor film 20b. Accordingly, by performing an LITI operation of the second donor film 20b, a stacked structure in which the pixel electrode 11, the hole injection/transport layer 12, and the insulating layer 23 are stacked on the substrate 10 is formed as illustrated in FIG. 7C. Here, laser is not irradiated completely on the second donor film 20b, but is partially irradiated so that the insulating layer 23 is transferred only in a form that defines a light emission area. In other words, since the insulating layer 23 is not patterned on the second donor film 20b in advance, laser is partially irradiated so that only a desired form is transferred.

Figure 7D:
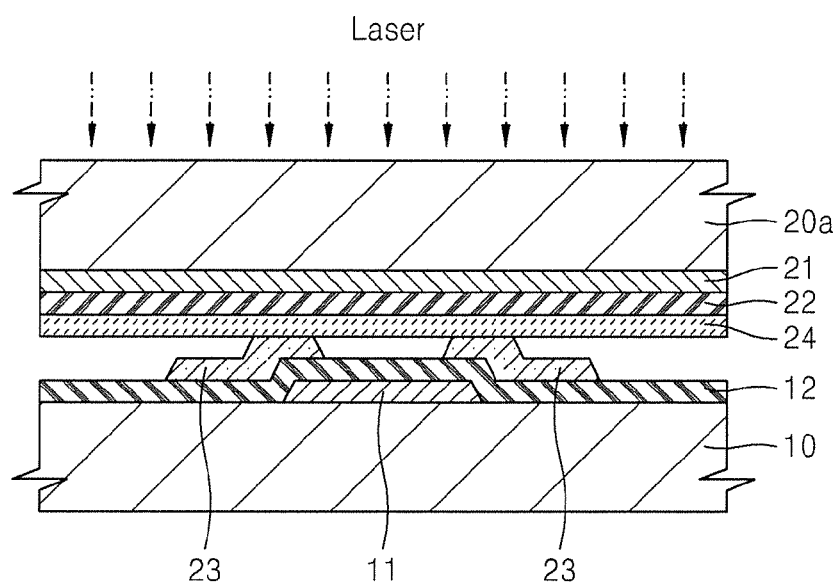
Figure 7E:
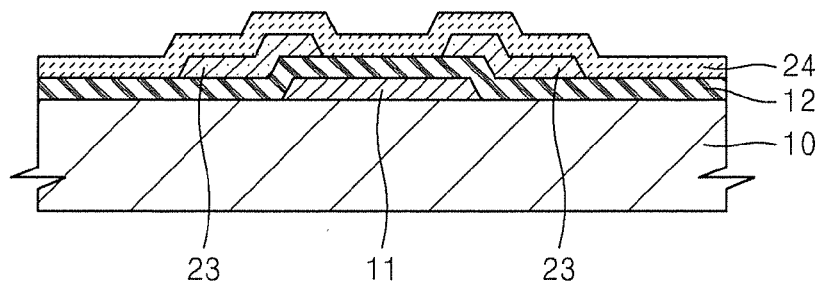

Then, as illustrated in FIG. 7D, a second donor film 20a is formed to perform an LITI operation. An LTHC layer 21 and a protection layer 22 are also formed on the second donor film 20a and then an emissive layer 24, which is to be transferred to the substrate 10, is formed on the protection layer 22. Accordingly, by performing an LITI operation on the second donor film 20a, a stacked structure in which the pixel electrode 11, the hole injection/transport layer 12, the emissive layer 24, and the insulating layer 23 are stacked on the substrate 10 is formed as illustrated in FIG. 7E.

Figure 7F:
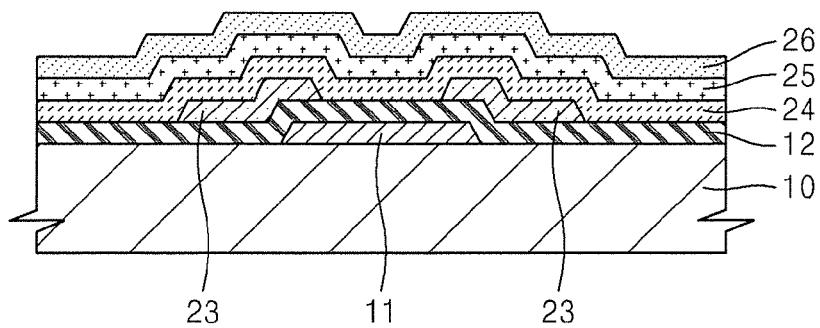

Then, as illustrated in FIG. 7F, an electron injection/transport layer 25 and an opposite electrode 26 are sequentially formed on the resultant structure, thereby completing the manufacture of the organic light-emitting display device of FIG. 2. Accordingly, without forming a pixel-defining layer, an organic layer, including the insulating layer 23 that functions the same as a pixel-defining layer, may be manufactured simply by using an LITI method using the first and second donor films 20a and 20b.

Figure 3:
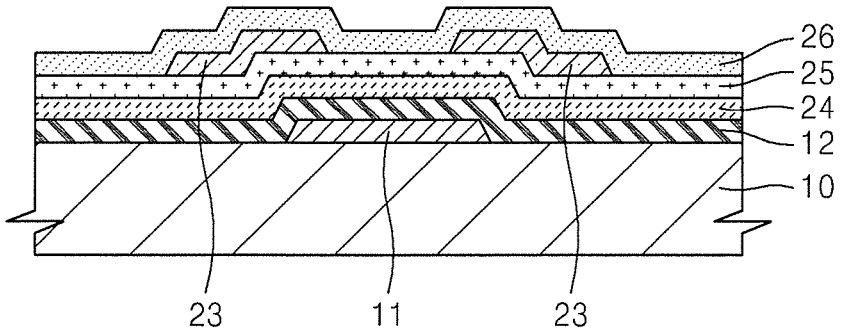
FIG. 3 is a cross-sectional view illustrating a structure of an organic light-emitting display device according to another embodiment of the present invention.

FIGS. 8A through 8E are cross-sectional views illustrating a method of manufacturing the organic light-emitting display device of FIG. 3, according to an embodiment of the present invention.

FIGS. 9A through 9F are cross-sectional views illustrating a method of manufacturing the organic light-emitting display device of FIG. 3, according to another embodiment of the present invention.

Then, the organic light-emitting display device illustrated in FIG. 3 may be manufactured according to the operations illustrated in FIGS. 8A through 8E or the operations illustrated in FIGS. 9A through 9F.

The operations illustrated in FIGS. 8A through 8E will be described first.

Figure 8A:
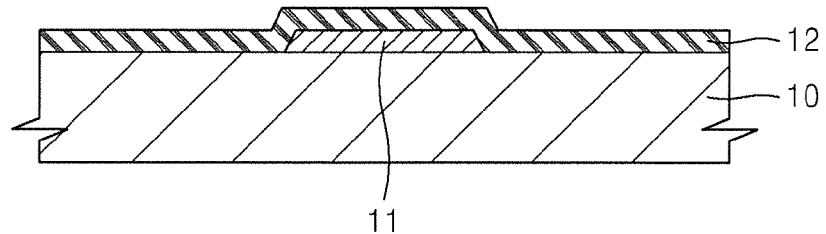
FIGS. 8A through 8E are cross-sectional views illustrating a method of manufacturing the organic light-emitting display device of FIG. 3, according to an embodiment of the present invention.

First, as illustrated in FIG. 8A, a pixel electrode 11 is formed on a substrate 10, on which a thin-film transistor (not shown) is formed, and a hole injection/transport layer 12 is formed on the pixel electrode 11.

Figure 8B:
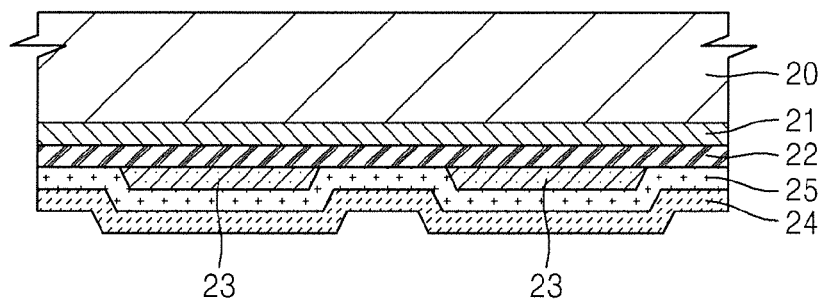

When the substrate 10, on which the pixel electrode 11 and the hole injection/transport layer 12 are formed, is prepared, then as illustrated in FIG. 8B, a donor film 20 is provided. Basically, an LTHC layer 21 and a protection layer 22 for thermal transfer are formed on the donor film 20, and an insulating layer 23 and an emissive layer 24, which are thin layers to be transferred to the substrate 10, are formed on the LTHC layer 21 and the protection layer 22. Here, the insulating layer 23 is patterned in advance so as to define a light emission area of the emissive layer 24. In other words, the insulating layer 23 is uniformly formed on the protection layer 22 and then patterned into a form to define the light emission area of the emissive layer 24.

Figure 8C:
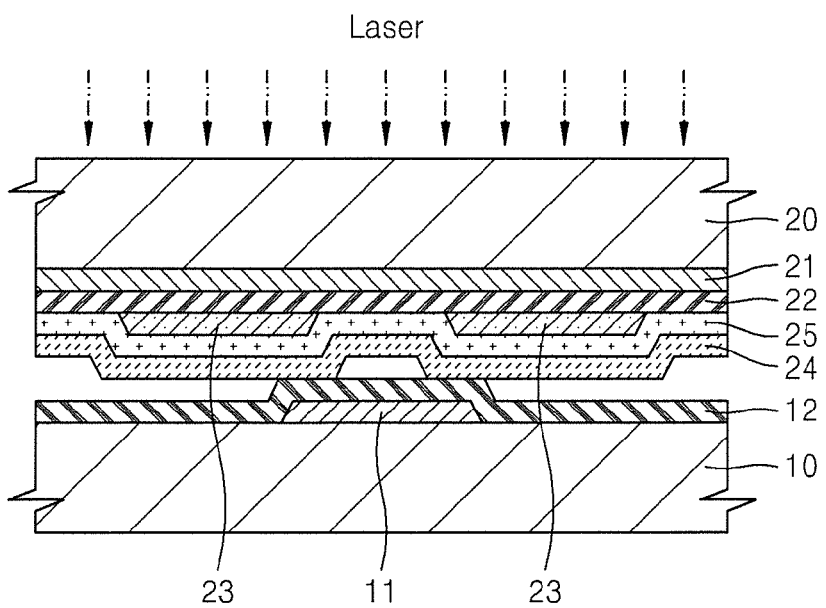

Then, the donor film 20 and the substrate 10 provided in the above-described manner are adhered to each other as illustrated in FIG. 8C, and then laser is completely irradiated to the donor film 20 so that the emissive layer 24 and the insulating layer 23 are transferred to the substrate 10.

Figure 8D:
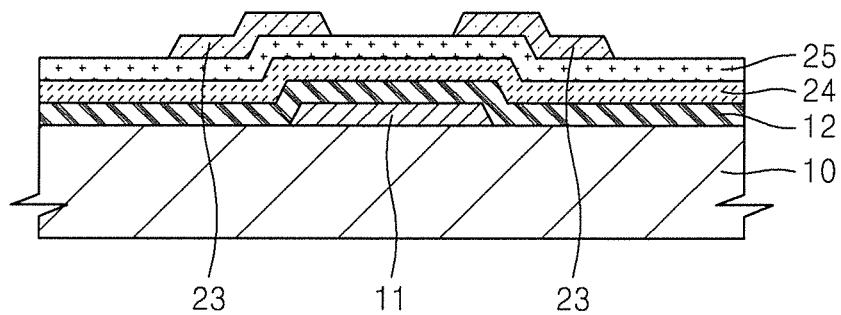

Then, as illustrated in FIG. 8D, the pixel electrode 11, the hole injection/transport layer 12, the emissive layer 24, the electron injection/transport layer 25, and the insulating layer 23 are sequentially stacked on the substrate 10.

Figure 8E:
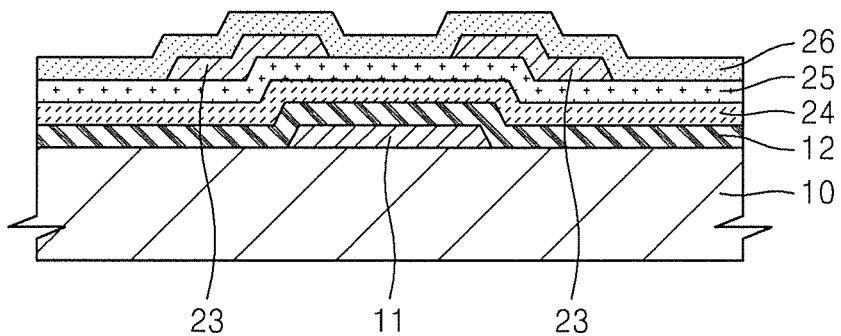

Then, as illustrated in FIG. 8E, an opposite electrode 26 is formed on the resultant structure, thereby completing the manufacture of the organic light-emitting display device of FIG. 3. Accordingly, without forming a pixel-defining layer, an organic layer, including the insulating layer 23 that functions the same as a pixel-defining layer, may be manufactured simply by using an LITI method using the donor film 20.

Then, a method of manufacturing the organic light-emitting display device of FIG. 3 according to the operations illustrated in FIGS. 9A through 9E will be described.

Figure 9A:
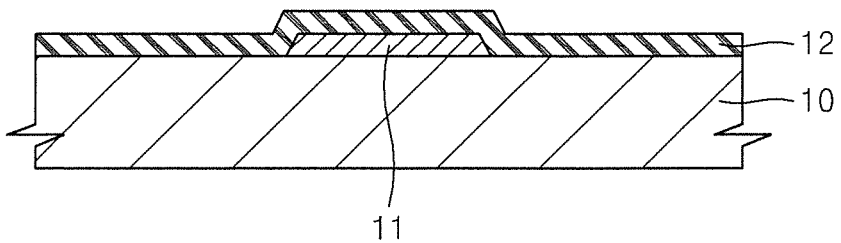
FIGS. 9A through 9F are cross-sectional views illustrating a method of manufacturing the organic light-emitting display device of FIG. 3, according to another embodiment of the present invention.

First, as illustrated in FIG. 9A, a pixel electrode 11 is formed on a substrate 10 on which a thin-film transistor (not shown) is formed, and a hole injection/transport layer 12 is formed on the pixel electrode 11.

Figure 9B:
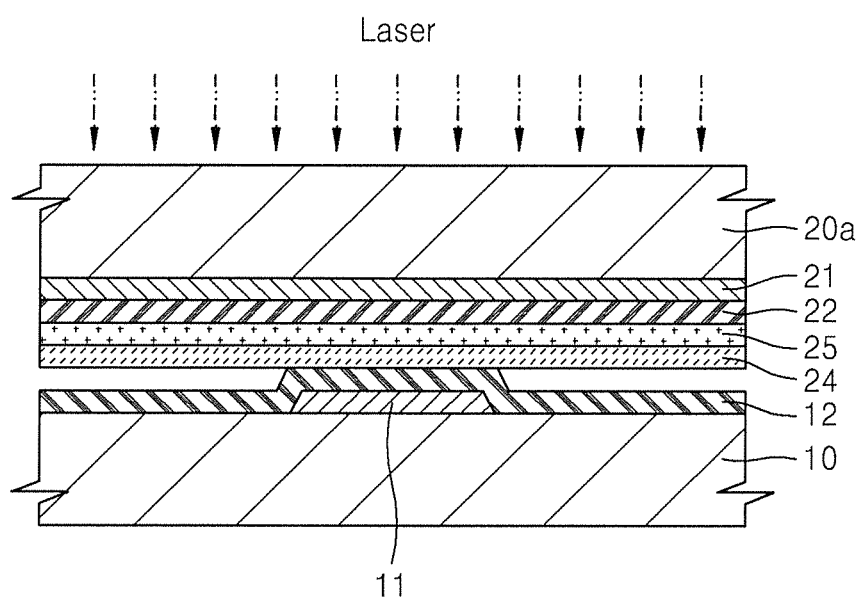
Figure 9C:
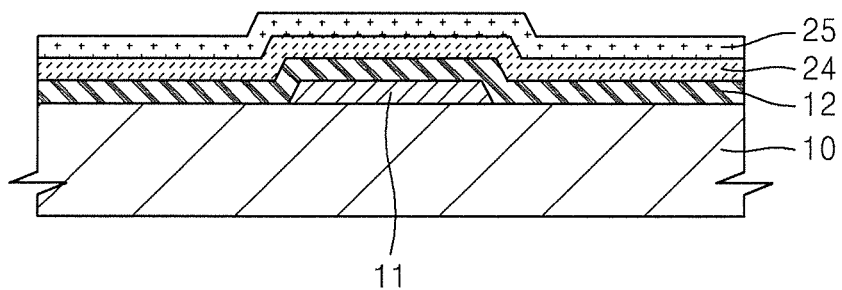

Then, a first donor film 20a as illustrated in FIG. 9B is adhered to the substrate 10 on which the pixel electrode 11 and the hole injection/transport layer 12 are formed to perform an LITI method. An LTHC layer 21 and a protection layer 22 for an LITI method and an electron injection/transport layer 25 and an emissive layer 24, which are thin layers to be transferred to the substrate 10, are formed on the first donor film 20a. Accordingly, by performing a laser thermal imaging operation of the first donor film 20a, a stacked structure in which the pixel electrode 11, the hole injection/transport layer 12, the emissive layer 24, and the electron injection/transport layer 25 are stacked on the substrate 10 is formed as illustrated in FIG. 9C.

Figure 9D:
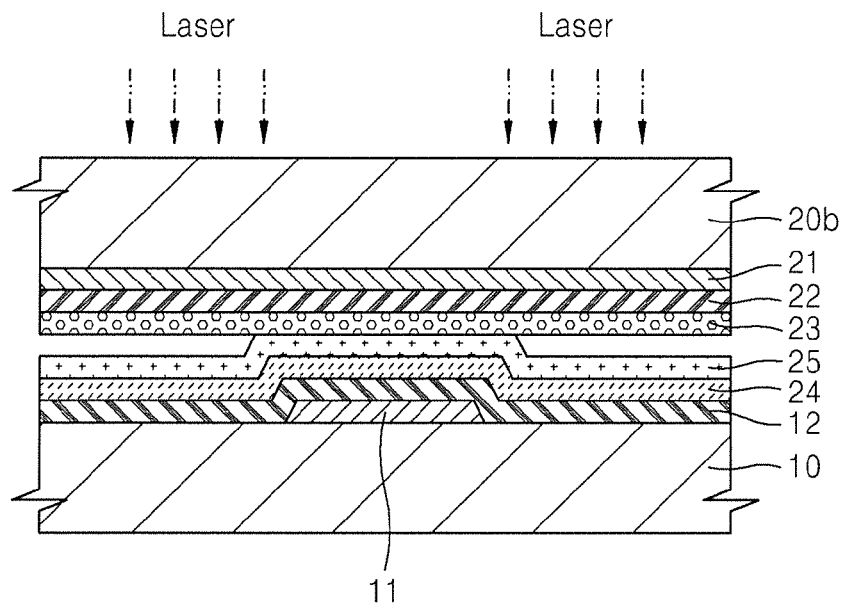
Figure 9E:
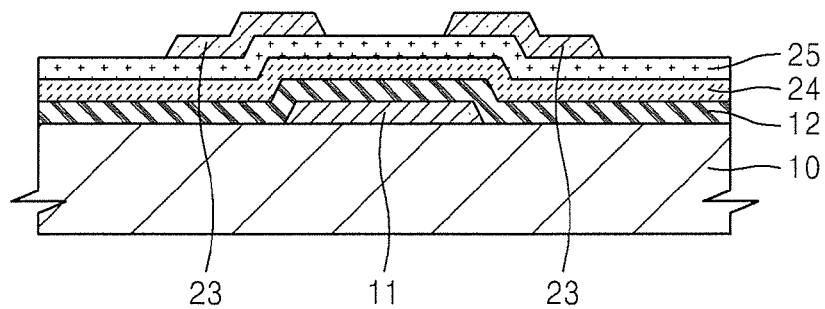

Then, a second donor film 20b is formed to perform an LITI operation as illustrated in FIG. 9D. An LTHC layer 21 and a protection layer 22 are also formed on the second donor film 20b and then an insulating layer 23, which is to be transferred to the substrate 10, is formed on the protection layer 22. Accordingly, by performing an LITI operation to the second donor film 20b, a stacked structure in which the pixel electrode 11, the hole injection/transport layer 12, the emissive layer 24, and the insulating layer 23 are stacked on the substrate 10 is formed as illustrated in FIG. 9E. Here, a laser is not completely irradiated on the second donor film 20b, but only partially so that the insulating layer 23 is transferred only in a form that defines a light emission area. In other words, since the insulating layer 23 is not patterned on the second donor film 20b in advance, laser imaging is partially performed so that only a desired form is transferred.

Figure 9F:
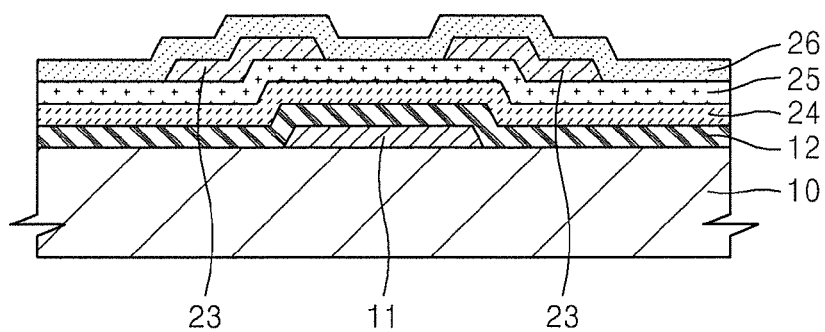

Then, as illustrated in FIG. 9F, an opposite electrode 26 is formed on the resultant structure, thereby completing the manufacture of the organic light-emitting display device of FIG. 3. Accordingly, without forming a pixel-defining layer, an organic layer, including the insulating layer 23 that functions the same as a pixel-defining layer, may be manufactured simply by using an LITI method using the first and second donor films 20a and 20b.

When manufacturing an organic light-emitting display device according to embodiments of the present invention as described above, an organic layer including an insulating layer, which functions as a pixel-defining layer may be simply formed without forming an additional pixel-defining layer.

Accordingly, edge open generated in an emissive layer due to a thick pixel-defining layer according to the comparable art may be prevented.

According to the organic light-emitting display devices and methods of manufacturing the same, an insulating layer inside an organic layer functions as a pixel-defining layer, and thus, an additional pixel-defining layer is not necessary. Thus, edge open, which is caused when an emissive layer is formed on a thick pixel-defining layer, may be solved.

While the present invention has been particularly shown and described with reference to exemplary embodiments thereof, it will be understood by those of ordinary skill in the art that various changes in form and details may be made therein without departing from the spirit and scope of the present invention as defined by the following claims, with equivalents of the claims to be included therein.

What is claimed is:

1. An organic light-emitting display device comprising a pixel electrode, an opposite electrode facing the pixel electrode, and an organic layer between the pixel electrode and the opposite electrode,
   wherein the organic layer comprises an emissive layer for emitting light, an insulating layer in the organic layer between the pixel electrode and the opposite electrode and defining a light emission area of the emissive layer, a hole injection/transport layer between the emissive layer and the pixel electrode for supplying holes to the emissive layer, and an electron injection/transport layer between the emissive layer and the opposite electrode for supplying electrons to the emissive layer,
   wherein the insulating layer is between the emissive layer and the electron injection/transport layer, and is wholly separated from the pixel electrode by an other layer within the organic layer, and
   wherein the insulating layer and at least a portion of the emissive layer overlap in a thickness direction.

2. The organic light-emitting display device of claim 1, wherein the insulating layer defines the light emission area in units of pixels.

3. The organic light-emitting display device of claim 1, wherein the insulating layer has a thickness of about 500 Å to about 2000 Å.

4. The organic light-emitting display device of claim 1, wherein the other layer is a hole injection/transport layer.

* * * * *